US009412551B2

(12) United States Patent
Saito et al.

(10) Patent No.: US 9,412,551 B2
(45) Date of Patent: Aug. 9, 2016

(54) CATHODE OBTAINING METHOD AND ELECTRON BEAM WRITING APPARATUS (71) Applicant: NuFlare Technology, Inc., Yokohama (JP)

(72) Inventors: Kenichi Saito, Atsugi (JP); Ryoei Kobayashi, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/721,380

(22) Filed: May 26, 2015

(65) Prior Publication Data
US 2015/0357146 A1    Dec. 10, 2015

(30) Foreign Application Priority Data
Jun. 9, 2014  (JP) .................................. 2014-119071

(51) Int. Cl.
*H01J 9/42* (2006.01)
*H01J 1/13* (2006.01)
*H01J 9/02* (2006.01)
*H01J 37/06* (2006.01)
*H01J 37/317* (2006.01)

(52) U.S. Cl.
CPC ................. *H01J 9/022* (2013.01); *H01J 37/06* (2013.01); *H01J 37/3174* (2013.01)

(58) Field of Classification Search
USPC .............. 313/1, 2.1, 409, 411, 446, 270, 302; 315/1, 2, 9, 94, 99, 98; 250/423 R, 250/423 F, 423 P, 424, 426, 427
See application file for complete search history.

(56) References Cited

U.S. PATENT DOCUMENTS

| 5,859,508 A * | 1/1999 | Ge .................... H01J 29/028 313/422 |
| 2010/0141866 A1* | 6/2010 | Ryu .................... H01J 63/02 349/61 |
| 2014/0117839 A1* | 5/2014 | Saito .................... H01J 1/13 313/421 |

FOREIGN PATENT DOCUMENTS

JP    2012-069364    4/2012

* cited by examiner

*Primary Examiner* — Nicole Ippolito
(74) *Attorney, Agent, or Firm* — Oblon, McClelland, Maier & Neustadt, L.L.P.

(57) ABSTRACT

A cathode obtaining method includes producing a plurality of cathodes each including an electron emission member and a cover part, provided with a gap, which covers a side surface of the electron emission member, measuring an outer dimension of the upper surface of the electron emission member, for each of a plurality of cathodes, measuring an outer dimension of the gap at the same surface as the upper surface of the electron emission member, for each of a plurality of cathodes, calculating an area ratio by dividing the area of the gap, for each of a plurality of cathodes, obtaining an upper limit of the area ratio corresponding to a desired brightness by using a correlation between brightness and the area ratio, and selecting a cathode having the area ratio less than or equal to the upper limit from a plurality of cathodes that have been produced.

11 Claims, 12 Drawing Sheets

Related Art

FIG. 13

Related Art

FIG. 14

CATHODE OBTAINING METHOD AND ELECTRON BEAM WRITING APPARATUS

CROSS-REFERENCE TO RELATED APPLICATION

This application is based upon and claims the benefit of priority from the prior Japanese Patent Application No. 2014-119071 filed on Jun. 9, 2014 in Japan, the entire contents of which are incorporated herein by reference.

BACKGROUND OF THE INVENTION

1. Field of the Invention

Embodiments of the present invention relate generally to a method for obtaining a cathode and an electron beam writing apparatus, and more specifically, for example, relate to a method for selecting a cathode of a beam source used in an electron beam writing apparatus.

2. Description of Related Art

In recent years, with high integration of LSI, the line width (critical dimension) required for circuits of semiconductor devices is becoming progressively narrower. As a method for forming an exposure mask (also called a reticle) used to form circuit patterns on these semiconductor devices, the electron beam (EB) writing technique having excellent resolution is employed.

Figure 12:
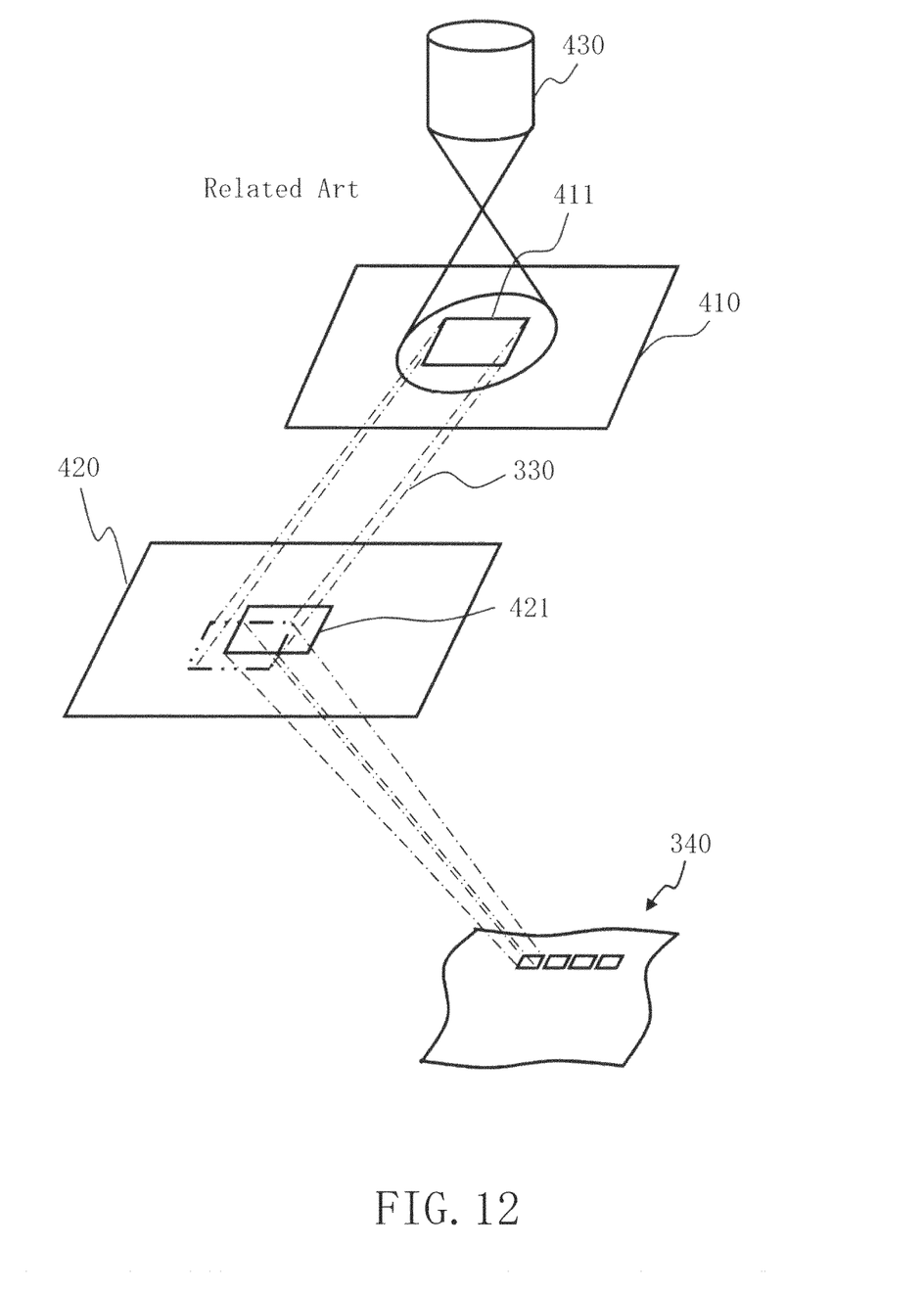
FIG. 12 is a conceptual diagram explaining operations of a variable shaped electron beam writing apparatus.

FIG. 12 is a conceptual diagram explaining operations of a variable shaped electron beam (EB) writing or "drawing" apparatus. The variable shaped electron beam writing apparatus operates as described below. A first aperture plate 410 has a quadrangular aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., the x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

In electron beam writing, an electron gun assembly is used. As a cathode material of the electron gun assembly, lanthanum hexaboride ($LaB_6$), cerium hexaboride ($CeB_6$), hafnium carbide (HfC), or the like which is in sintered or crystalline form is used. Such cathode material is used as electron sources or emitters in various electronic beam apparatuses (e.g., lithographic apparatuses, scanning electron microscopes (SEMs), transmission electron microscopes (TEMs), etc.). The cathode is formed to be a tapered shape with a cone angle, or a conical shape with a truncated flat tip (top), for example.

Figure 13:
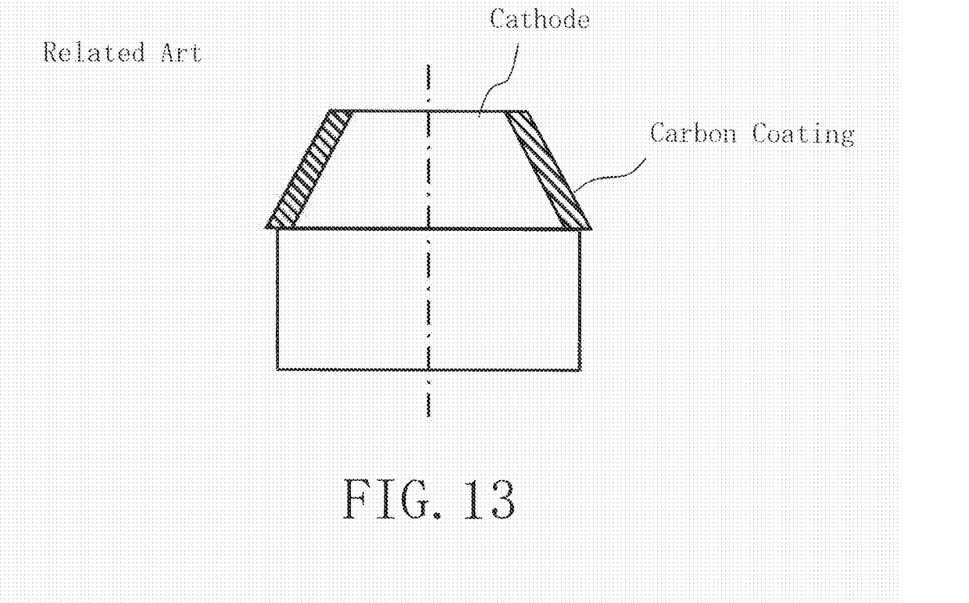
FIG. 13 shows an example of a cathode whose conical surface is coated with carbon.

FIG. 13 shows an example of a cathode whose conical surface is coated with carbon. As shown in FIG. 13, the conical surface made of the cathode material is coated with carbon. By this structure, the electron emission surface is limited to the cathode upper surface, and therefore, the emission area can be limited. By utilizing this, to improve the brightness (luminance or intensity) of the electron gun has been attempted.

Figure 14:
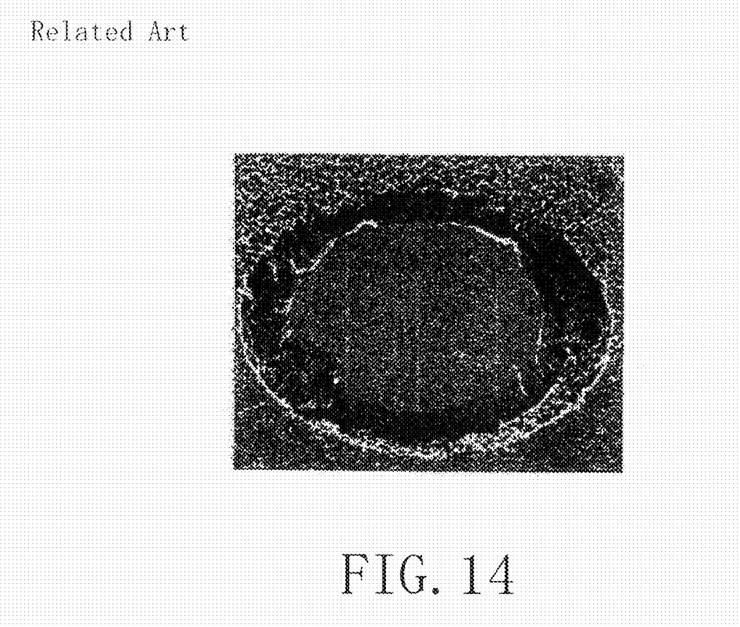
FIG. 14 shows an example of the upper surface of a cathode whose side surface is coated with carbon.

FIG. 14 shows an example of the upper surface of a cathode whose side surface is coated with carbon. As shown in FIG. 14, the electron emission surface of the cathode has been corroded by a chemical interaction between the carbon coating and the cathode material such as $LaB_6$ or $CeB_6$. Moreover, as shown in FIG. 14, the periphery of the electron emission surface in contact with the carbon coating appears to have been damaged (for example, pitted and/or etched). In fact, the electron emission surface area is impaired, and thus, is no longer capable of efficiently emitting electrons. Then, a structure has been proposed in which a gap (space) is provided between the cathode material and the carbon coating, in the vicinity of the periphery of the electron emission surface of a cathode (refer to, e.g., Japanese Unexamined Patent Publication No. 2012-069364). Thereby, it is possible to inhibit the chemical reaction between the carbon coating and the electron emission surface periphery of the cathode.

Here, there is a problem in that if the gap between the cathode body (emitter) and the carbon coating is large, the brightness is deteriorated. Since variation occurs in products due to a process of applying a sacrificial film for forming the gap and of removing it, dispersion occurs in gap distance of produced products (cathodes). Cathodes with large gaps are unable to realize high brightness required for the electron beam writing apparatus. It is conventionally difficult to discern whether the produced cathode can achieve high brightness or not from its appearance. Therefore, there has occurred a problem in that since brightness deficiency is found after actually installing a produced cathode in a writing apparatus, the cathode turns out to be unusable, which is a reason to lower the apparatus reliability.

BRIEF SUMMARY OF THE INVENTION

According to one aspect of the present invention, a cathode obtaining method includes producing a plurality of cathodes each of which includes an electron emission member and a cover part, provided with a gap, wherein the cover part covers a side surface of the electron emission member, measuring an outer dimension of an upper surface of the electron emission member, for each cathode of the plurality of cathodes, measuring an outer dimension of the gap at a same surface as the upper surface of the electron emission member, for the each cathode of the plurality of cathodes, calculating an area ratio by dividing an area of the gap at the same surface by an area of the upper surface of the electron emission member, for the each cathode of the plurality of cathodes, obtaining an upper limit of the area ratio corresponding to a desired brightness by using a correlation between brightness and the area ratio, and selecting a cathode having the area ratio less than or equal to the upper limit from the plurality of cathodes that have been produced.

According to another aspect of the present invention, an electron beam writing apparatus includes an electron gun in which a cathode obtained by the cathode obtaining method described above is mounted, and a writing unit configured to write a pattern on a target object, using an electron beam emitted from the cathode.

Moreover, according to another aspect of the present invention, a cathode obtaining method includes producing a cathode that includes an electron emission member and a cover part, provided with a gap, wherein the cover part covers a side surface of the electron emission member, measuring an outer dimension of an upper surface of the electron emission member of the cathode, measuring an outer dimension of the gap, at a same surface as the upper surface of the electron emission member, of the cathode, calculating an area ratio of the cathode by dividing an area of the gap at the same surface by an area of the upper surface of the electron emission member, obtaining an upper limit of the area ratio corresponding to a desired brightness by using a correlation between and the area ratio having been obtained in advance, and determining whether the cathode produced has the area ratio less than or equal to the upper limit, and obtaining the cathode having the area ratio less than or equal to the upper limit.

DETAILED DESCRIPTION OF THE INVENTION

First Embodiment

Ina first embodiment, there will be described a method for obtaining a cathode with which a desired brightness level can be acquired.

Figure 1:
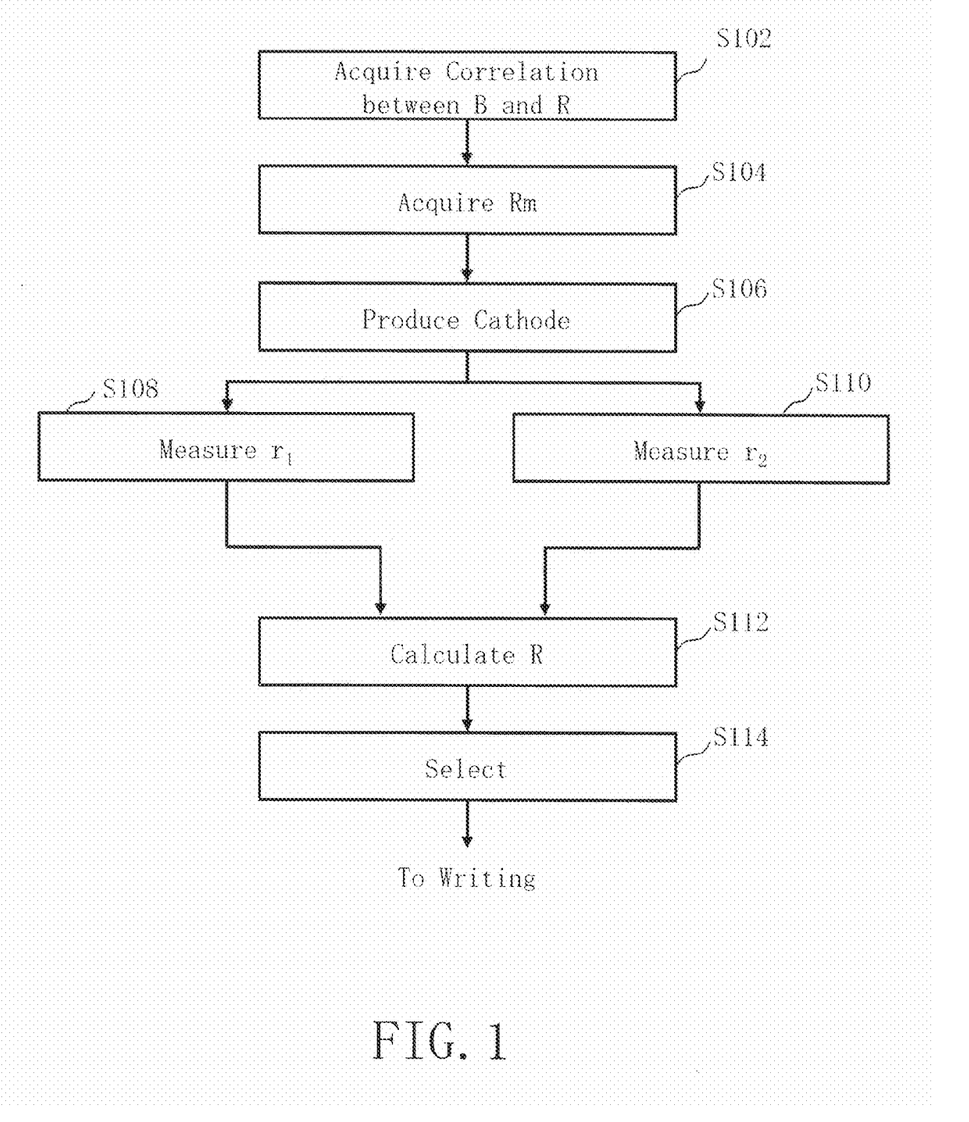
FIG. 1 is a flowchart showing main steps of a cathode obtaining method according to a first embodiment.

FIG. 1 is a flowchart showing main steps of a cathode obtaining method according to the first embodiment. As shown in FIG. 1, the cathode obtaining method of the first embodiment executes a series of steps: a correlation acquisition step (S102) for acquiring correlation between the brightness (B) and the area ratio (R), an upper limit area ratio (Rm) acquisition step (S104), a cathode production step (S106), a radius ($r_1$) measurement step (S108), a radius ($r_2$) measurement step (S110), an area ratio (R) calculation step (S112), and a selection step (S114). The radius (r1) measurement step (S108) and the radius (r2) measurement step (S110) may be performed simultaneously or separately. When performed separately, either one of them may be performed first. Moreover, either one of the group of steps from the correlation acquisition step (S102) to the upper limit area ratio (Rm) acquisition step (S104) and the group of steps from the cathode production step (S106) to the area ratio (R) acquisition step (S112) may be performed first.

Figure 2:
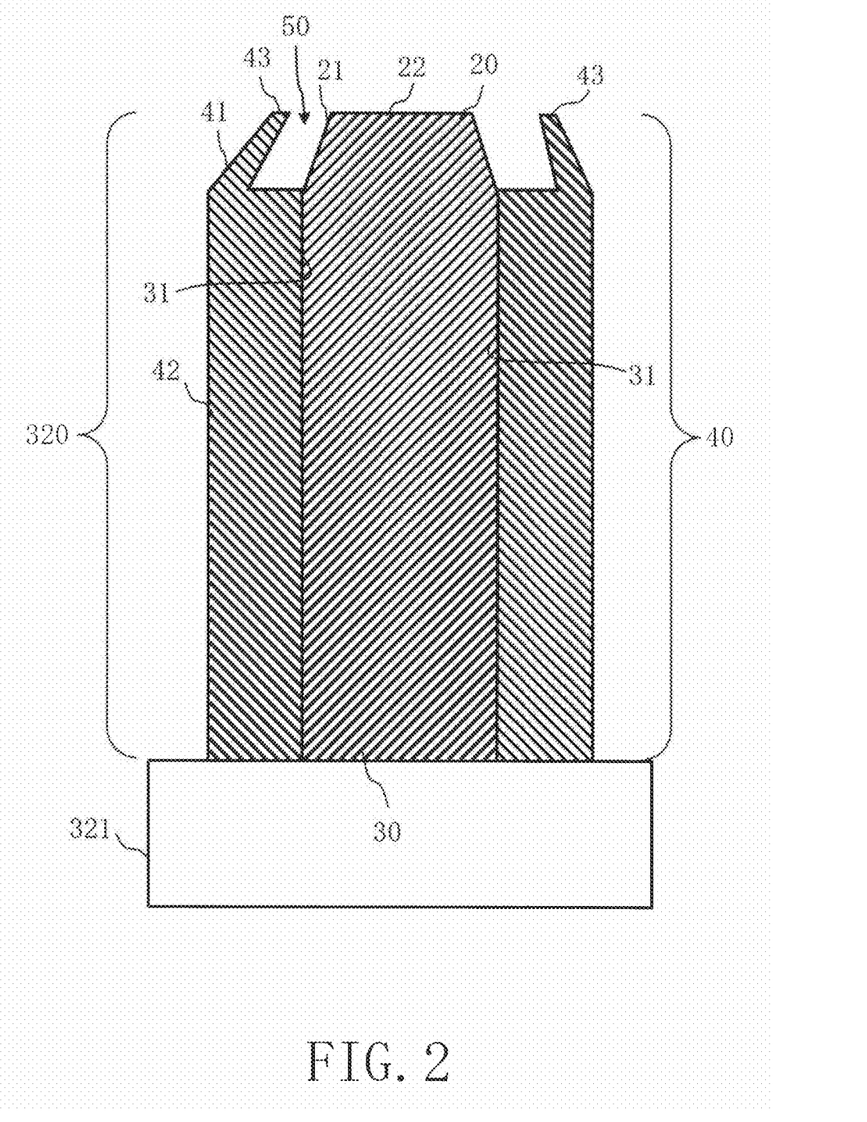
FIG. 2 is a sectional view showing an example of the structure of a cathode according to the first embodiment.

FIG. 2 is a sectional view showing an example of the structure of a cathode according to the first embodiment. In FIG. 2, a cathode 320 is fixed on a cathode holder 321. The cathode 320 is composed of a cathode body 30 (electron emission member) (also called an "emitter") and a side cover part 40. It is preferable for the cathode body 30 to be made from lanthanum hexaboride ($LaB_6$) or cerium hexaboride ($CeB_6$) which is in sintered or crystalline form. A lower part of the cathode body 30 is cylindrical, and an upper part 20 of it includes a conical side surface 21 (inclined surface) and an upper surface 22 (electron emission surface) of a truncated cone formed by truncating the conical tip (top) to be flat.

The side cover part 40 (coated part) includes an upper cover part 41 which is tapered (conical surface) and a lower cover part 42 which is cylindrical. As shown in FIG. 2, the lower cover part 42 directly adheres to a lower peripheral surface 31 of the cathode body 30, in the lengthwise direction. That is, the lower cover part 42 encloses and contacts the lower peripheral surface 31 of the cathode body 30. On the other hand, the upper cover part 41 does not directly contact the upper side surface 21 of the cathode. In fact, there exists a gap 50 between them. The gap 50 can be in the range from about 1 μm to about 15 μm wide, for example. Besides, depending on usage, the gap 50 can be smaller or larger than the range. The upper cover part 41 has an upper surface 43 which is substantially on the same plane as the upper surface 22 of the cathode body 30.

Figure 3:
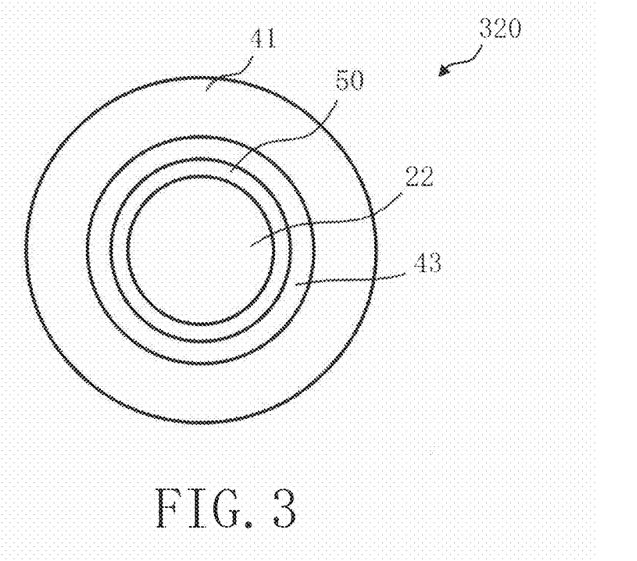
FIG. 3 shows a top view of the plane of a cathode emission surface according to the first embodiment.

FIG. 3 shows a top view of the plane of the cathode emission surface according to the first embodiment. The size of the structure shown in each of FIGS. 2, 3, and 4 (which is to be described later) may be different from each other. Therefore, they are not to scale. FIG. 3 shows the upper surface 22 of the cathode body 30 in the center enclosed by the annular gap 50. The gap 50 is enclosed by the upper end of the upper cover part 41 of the cover part 40 or by the upper surface 43 shown in FIG. 2.

Figure 4:
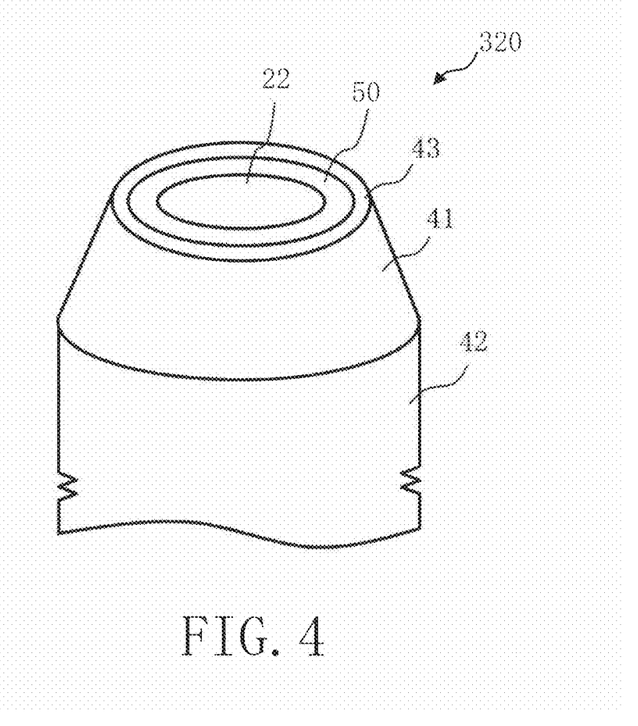
FIG. 4 is a perspective view of the upper part of a cathode according to the first embodiment.

FIG. 4 is a perspective view of the upper part of a cathode according to the first embodiment. As shown in FIG. 4, the gap 50 is surrounded by the upper end of the upper cover part 41 or by the upper surface 43. As described above, in the cover part 40, the upper cover part 41 is integrally connected to the lower cover part 42.

The upper part 20 of the cathode body 30, which may be formed, for example, to be 10 μm to 200 μm, may be conical, cylindrical, cubic, cuboid, pyramidal, etc., and all such embodiments are included in the first embodiment. In the cases of FIGS. 2 to 4, the upper part 20 is a truncated cone, and preferably, its cone angle is in the range of 90 degrees or less, for example. It should not be larger than 90 degrees, and, more preferably, is in the range from about 20 degrees to about 90 degrees (e.g., about 20, 25, 30, 35, 40, 45, 50, 55, 60, 65, 70, 75, 80, 85, or 90 degrees). Further, still more preferably, it is in the range from 60 degrees to 90 degrees (e.g., about 60, 65, 70, 75, 80 and 85, or 90 degrees).

It is preferable for the width of the gap 50, which makes the upper part 20 of the cathode body 30 and the upper cover part 41 apart from each other, to be about 1 μm to about 15 μm, and for the depth of the gap 50, which is along the conical surface, to be, for example, 10 μm to 200 μm. For example, the gap 50 exists along (encompasses, covers, etc.) the entire side surface 21, terminating at the upper end of the cathode body 30.

The carbon layer, which surrounds the conical surface 21 while being apart therefrom due to the presence of the gap 50, traces (follows) the contour of the cone, as shown by the upper cover part 41 of FIG. 2. Therefore, the carbon layer itself forms a conical shape, and, is preferably positioned at the same or similar angle to that of the cone.

The cover part 40 shown in FIG. 2 is formed by a carbon (C) layer or carbon coating. The carbon layer or carbon coating may be formed from suitable arbitrary material, such as graphite, colloidal graphite (e.g., aquadag), DLC (diamond-like carbon), pyrolytic carbon, etc., but not limited thereto.

The upper surface 22 of the cathode body 30 may preferably range in size, for example, from 5 µm to 400 µm in diameter depending on a desired truncation degree and a desired cone angle. For example, it may be a circular flat surface of 100 µm in diameter.

An exemplary prior art cathode having a carbon coated emission surface is described, for example, in U.S. Pat. No. 7,176,610, the entire contents of which are incorporated herein by reference in entirety.

Figure 5A:
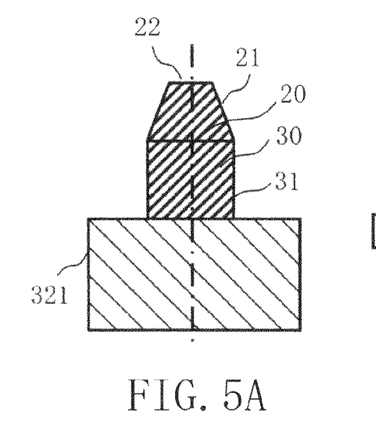
FIGS. 5A to 5D are sectional views showing main steps of an example of a method for producing a cathode according to the first embodiment.
Figure 5B:
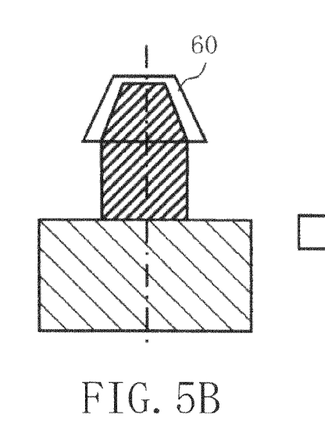
Figure 5C:
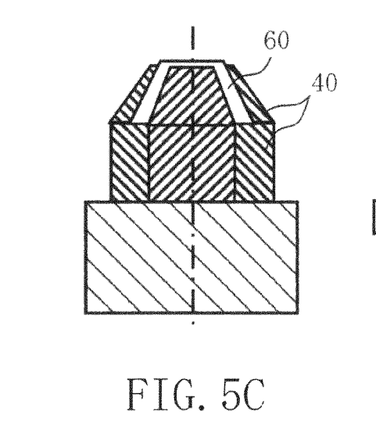
Figure 5D:
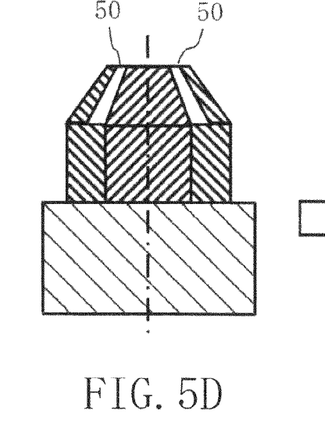

FIGS. 5A to 5D are sectional views showing main steps of an example of a method for producing a cathode according to the first embodiment. FIG. 5A shows the cathode body 30 arranged on the cathode holder 321. FIG. 5B shows a sacrificial film 60 coated by temporary or sacrificial coating on the conical side surface and the upper surface of the upper part 20 of the cathode body 30. FIG. 5C shows the state in which the entire side surface of the cathode body 30 is coated with the material of the cover part 40 through the sacrificial film 60. FIG. 5D shows the state in which the sacrificial film 60 has been removed leaving the gap 50 between the conical side surface of the upper part 20 of the cathode body 30 and the cover part 40 that surrounds, but does not directly contact, the conical side surface. Moreover, the upper surface of the cover part 40 is preferably planarized to be on the same plane as the upper surface of the cathode body 30. As material of the sacrificial film 60, various organic films, acrylic resin, nitrocellulose, and the like can be used, but not limited thereto. As examples of the organic films, 4-methacryloyloxyethyl trimellitate anhydride (4-META), methyl methacrylate (MMA) (meta-methyl-metacrylate), or the like can be preferably used.

The method of removing the sacrificial film 60 will vary depending on the type of the material of the sacrificial film 60. For example, when the material of the sacrificial film 60 is organic, heat may be used to remove the film. For example, the temperature of heating the cathode can be up to the range between 400° C. and 600° C. Under such conditions, the organic film evaporates leaving the gap 50. Thus, when removing, it is necessary to apply sufficient heat to cause evaporation of the organic material.

When the material of the sacrificial film 60 is soluble, the sacrificial film 60 can be removed by exposing the cathode to a suitable solvent (e.g., water, an organic solvent, etc.). The sacrificial film 60 may be formed from suitable arbitrary material, and may be removed by a suitable arbitrary method that includes etching, dissolving, evaporating, melting, ablation, etc., but not limited to these, and that causes removal without damaging the other cathode elements.

Now, specifically, the cathode obtaining method according to the first embodiment is described below with reference to figures. In the correlation acquisition step (S102), the correlation between brightness (B) and area ratio (R) is acquired.

Figure 6A:
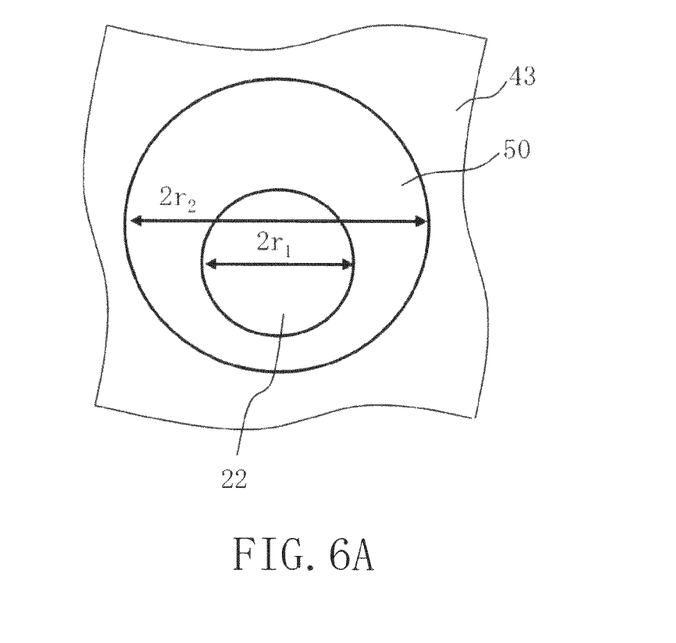
FIGS. 6A and 6B show a part of a cathode upper surface and a part of a cathode section according to the first embodiment.
Figure 6B:
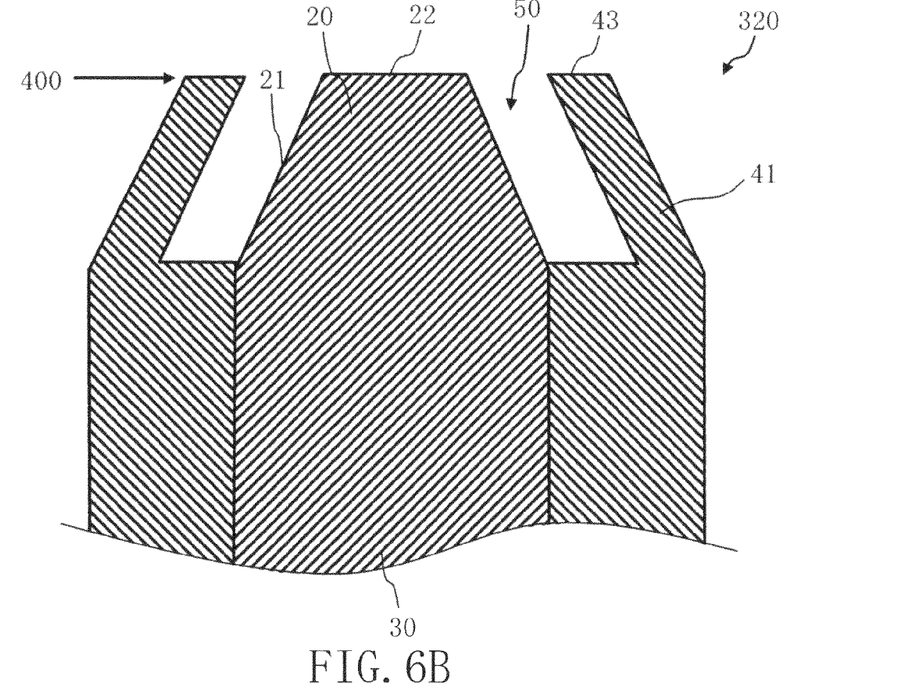

FIG. 6A shows a part of the cathode upper surface and FIG. 6B shows a part of the cathode section according to the first embodiment. The surface in FIG. 6A illustrates the state of the surface 400 which is the same surface as the upper surface 22 of the cathode as shown in FIG. 6B. The outer dimension (e.g., diameter) of the upper surface 22 of the cathode is defined by $2r_1$. Therefore, $r_1$ denotes the radius of the upper surface 22 of the cathode. The outer dimension (e.g., diameter) of the gap 50, at the surface 400 being the same surface as the upper surface 22 of the cathode, is defined by $2r_2$. Therefore, $r_2$ denotes the radius of the gap 50. The entire emission current Ie emitted from the cathode 320 is defined by the following equation (1) using a current $I_1$ of the electron emitted from the upper surface 22 of the cathode, and a current $I_2$ of the electron emitted from the side surface 21 (inclined surface) of the cathode upper part.

$$Ie = I_1 + I_2 \tag{1}$$

Moreover, a current density Jem is defined by the following equation (2) using the entire emission current Ie and the area of the upper surface 22 of the cathode.

$$Jem = Ie/\pi r_1^2 \tag{2}$$

The current density Jem is an amount obtained by dividing the entire emission current by the area of the emitter surface. If the shape of the upper surface 22 of the cathode, and the cathode drive current are determined, the current density Jem can be uniquely obtained.

Moreover, if it is assumed that a current density $Je_1$ of the electron, on the surface 400, emitted from the upper surface 22 of the cathode, and a current density $Je_2$ of the electron, on the surface 400, emitted from the side surface 21 (inclined surface) of the cathode upper part are fixed in the surface 400, the following equations (3) and (4) can be established.

$$I_1 = Je_1 \cdot \pi r_1^2 \tag{3}$$

$$I_2 = Je_2 \cdot \pi (r_2^2 - r_1^2) \tag{4}$$

Moreover, the equation (2) can be transformed into the following equation (5).

$$Jem = (I_1 + I_2)/\pi r_1^2 \tag{5}$$
$$= Je_1 + Je_2 \cdot \{(r_2/r_1)^2 - 1\}$$

Therefore, the current density $Je_1$ can be defined by the following equation (6).

$$Je_1 = Jem - Je_2 \cdot \{(r_2/r_1)^2 - 1\} \tag{6}$$

In the writing apparatus, since electrons emitted from the upper surface 22 of the cathode are used as beams, the brightness B of the cathode 320 when used in the writing apparatus can be defined by the Langmuir equation (7), using the current density $Je_1$, cathode temperature T, Boltzmann constant k, elementary charge e, and electronic potential (acceleration voltage) U.

$$B = Je_1(eU/\pi kT) \tag{7}$$
$$= 3693.8 Je_1(U/T)$$

Therefore, the brightness B of the cathode 320 can be transformed into the following equation (8).

$$B = 3693.8(U/T)(Jem - Je_2 \cdot \{(r_2/r_1)^2 - 1\}) \tag{8}$$

Here, an area ratio R obtained by dividing the area of the gap 50, at the surface 400 being the same surface as the upper surface 22 of the cathode, by the area of the upper surface 22 of the cathode is defined. The area ratio R is defined by the following equation (9).

$$R = \pi(r_2^2 - r_1^2)/\pi r_1^2 \qquad (9)$$
$$= (r_2/r_1)^2 - 1$$

Therefore, the brightness B of the cathode 320 can be transformed into the following equation (10).

$$B = 3693.8(U/T)(Jem - Je_2 \cdot R) \qquad (10)$$

Figure 7:
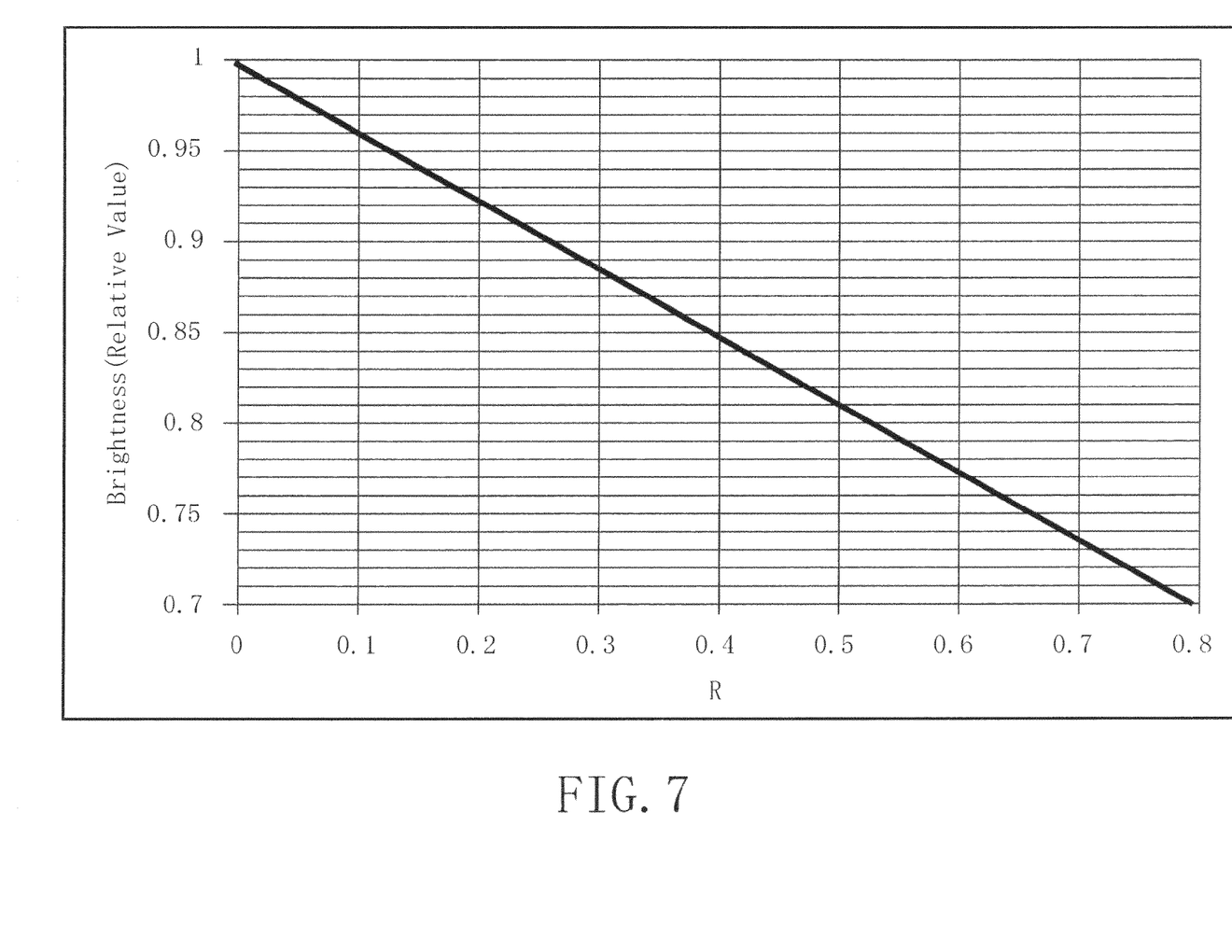
FIG. 7 shows an example of a relation, in an ideal state, between brightness and an area ratio according to the first embodiment.

FIG. 7 shows an example of a relation, in an ideal state, between the brightness and the area ratio according to the first embodiment. In FIG. 7, for example, the electronic potential (acceleration voltage) U=50 keV, T=1850K, and $Je_2$=0.38·Jem are defined as calculation conditions. As shown in the equation (9) and FIG. 7, when the area ratio R becomes large, the brightness B of the cathode 320 becomes small. Therefore, it turns out that the upper limit Rm of the area ratio R exists in order to obtain a desired brightness B. Then, according to the first embodiment, the correlation between the brightness B and the area ratio R is obtained. For this, a plurality of cathodes for experiment are created in advance while changing the area ratio R, and thus, the brightness B of each cathode for experiment is measured by experiment.

Figure 8:
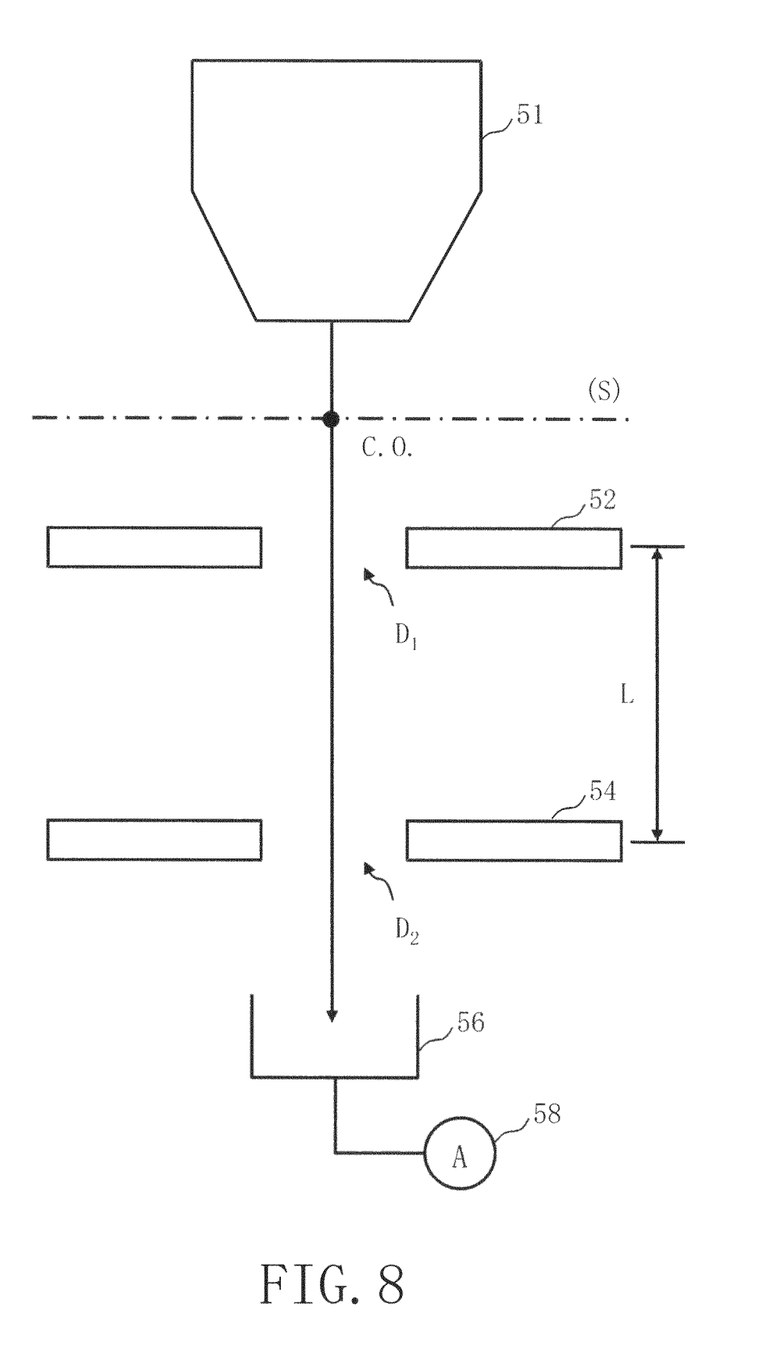
FIG. 8 illustrates a method for measuring brightness according to the first embodiment.

FIG. 8 illustrates a method for measuring brightness according to the first embodiment. With reference to FIG. 8, a so-called aperture method will be described as an example. However, the method for measuring brightness is not limited to this, and may be measured by other methods. Aperture members 52 and 54 are arranged in order of 52 and 54, while keeping a distance L between them, from the side of a cathode 51 for experiment. In the aperture members 52 and 54, there are formed openings whose centers are on the optical axis of the electron optical system and whose diameters are respectively $D_1$ and $D_2$. A Faraday cup 56 is arranged on the optical axis at the downstream side of the aperture member 54. In FIG. 8, a Wehnelt, an anode, a heating device, a voltage application device, etc., which are needed for an electron gun assembly, are not depicted. Electrons emitted from the cathode 51 for experiment irradiate the aperture member 52 after forming a crossover (c.o.). Electrons which have passed through the aperture member 52 irradiate the aperture member 54. Then, electrons which have passed through the aperture member 54 reach the Faraday cup 56. A current I of the electron which has reached the Faraday cup 56 is measured by an ammeter 58. In the aperture method, it is assumed that a crossover diameter S is sufficiently larger than the opening diameter $D_1$ of the aperture member 52, and any point in the opening of the aperture member 52 uniformly irradiates the aperture member 54. In that case, the brightness B of the cathode 51 for experiment can be defined by the following equation (11).

$$B = I/\{\pi(D_1/2)^2 \cdot \pi(D_2/2L)^2\} \qquad (11)$$

The area ratio R of each cathode for experiment can be calculated by using a measured value obtained by measuring the radius of the upper surface of the cathode for experiment and the outer dimension (radius) of the gap with an optical microscope, etc. As described above, the relation between the brightness B of each cathode for experiment and the area ratio R of each cathode for experiment can be obtained by using a plurality of cathodes for experiment whose area ratios R are different from each other.

Figure 9:
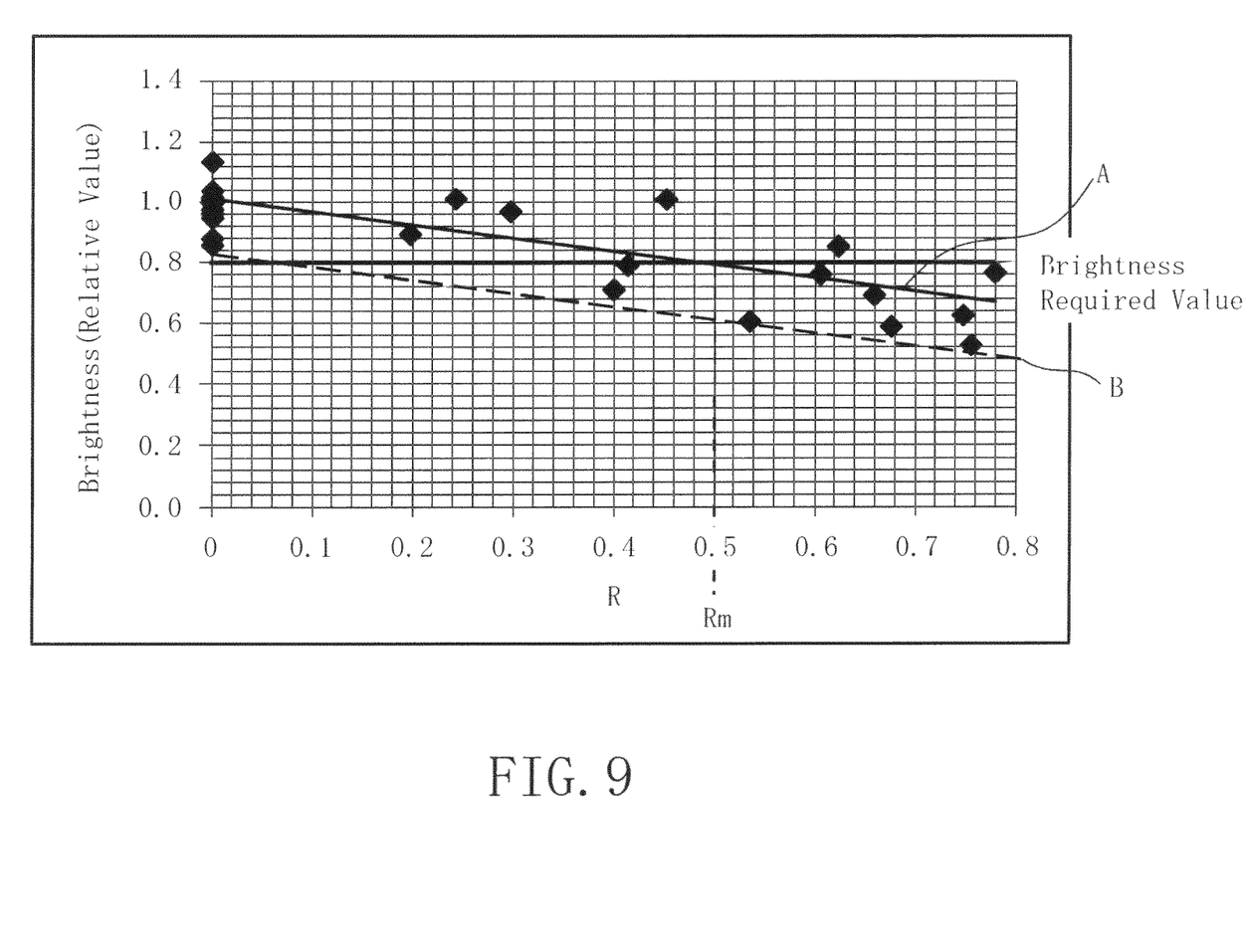
FIG. 9 shows an example of an experimental result with respect to a relation between brightness and an area ratio according to the first embodiment.

FIG. 9 shows an example of an experimental result with respect to the relation between the brightness and the area ratio according to the first embodiment. A graph is created by plotting the brightness B and the area ratio R obtained by experiment, and then, the correlation between the brightness B and the area ratio R is acquired. For example, a correlation A using a mean value of the brightness B is obtained. In FIG. 9, the ordinate axis defines brightness by using a value relative to brightness of the cathode produced without providing a gap. The abscissa axis defines the area ratio. Since the brightness obtained by experiment may vary, it is also preferable to be safe to use a correlation B approximated at the lower limit of a measured brightness.

In the upper limit area ratio (Rm) acquisition step (S104), an upper limit Rm of the area ratio corresponding to a desired brightness level is obtained using the correlation between the brightness B and the area ratio R. It is known from FIG. 9 that when the desired brightness level (relative value) is 0.8, the corresponding area ratio is 0.5, for example. Therefore, it turns out that the upper limit area ratio Rm is 0.5 in order to obtain the desired brightness level (relative value) 0.8.

In the cathode production step (S106), a plurality of cathodes 320 for production, each of which includes the cathode body 30 and the cover part 40, provided with the gap 50, covering the side surface 21 of the cathode body 30, are produced. The production method of the cathode 320 is what is described above.

In the radius ($r_1$) measurement step (S108), with respect to a plurality of cathodes 320 for production, the outer dimension (radius $r_1$) of the upper surface 22 of the cathode body 30 (electron emission member) is measured for each of a plurality of cathodes 320, using an optical microscope. Although a radius is measured in this case, it should be understood that a diameter ($2r_1$) may be measured.

In the radius ($r_2$) measurement step (S110), with respect to a plurality of cathodes 320 for production, the outer dimension (radius $r_2$) of the gap 50 at the surface 400 being the same surface as the upper surface 22 of the cathode body 30 (electron emission member) is measured for each of a plurality of cathodes 320, using an optical microscope. Although a radius is measured in this case, it should be understood that a diameter ($2r_2$) may be measured.

It is efficient to measure, for each cathode, the outer dimension (radius $r_1$) of the upper surface 22 and the outer dimension (radius $r_2$) of the gap 50 at the same time or period.

In the area ratio (R) calculation step (S112), an area ratio R is calculated by dividing the area of the gap 50 at the surface 400 being the same surface as the upper surface 22 by the area of the upper surface 22 of the cathode body 30 (electron emission member), for each of a plurality of cathodes 320 for production. The area ratio R can be obtained by using the equation (9) described above.

In the selection step (S114), a cathode 320 which has the area ratio R of, or less than, the upper limit Rm is selected from a plurality of cathodes 320 for production.

As described above, the cathode 320 capable of achieving a desired brightness B can be obtained from among a plurality of cathodes 320 for production. Therefore, the cathode responding to the high brightness is obtained.

As shown in FIG. 6A, it is also preferable to select a cathode in which the outer dimension of the gap 50 at the surface 400 being the same surface as the upper surface 22 and the shape of the upper surface 22 of the cathode body 30 (electron emission member) do not form concentric circles.

Figure 10:
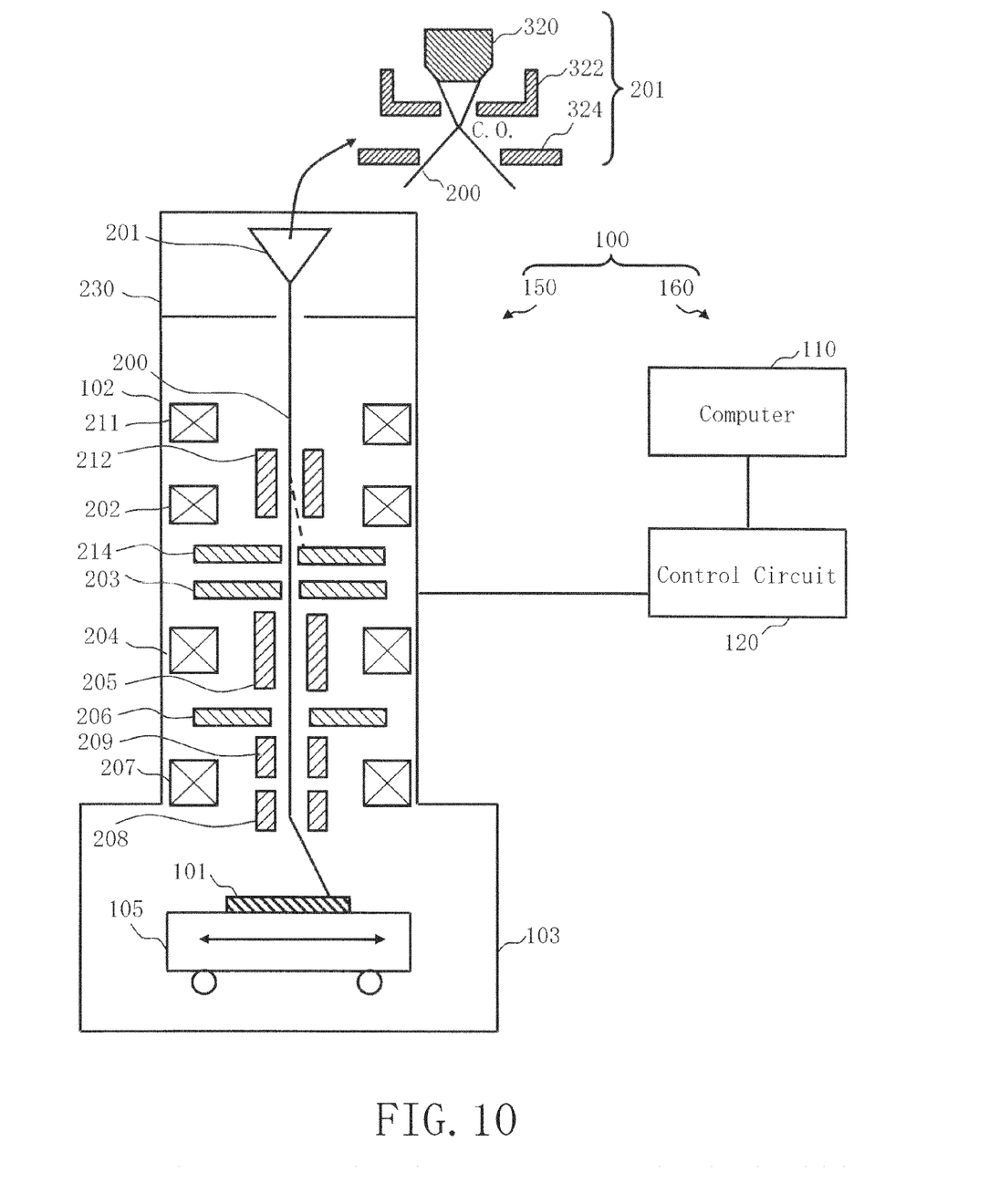
FIG. 10 is a schematic diagram showing a configuration of a writing apparatus in which an obtained cathode is mounted according to the first embodiment.

FIG. 10 is a schematic diagram showing a configuration of a writing apparatus in which the above-obtained cathode is mounted, according to the first embodiment. As shown in FIG. 10, a writing apparatus 100 includes a writing unit 150 and a control unit 160. The writing apparatus 100 is an example of a charged particle beam writing apparatus in which the selected (obtained) cathode 320 is mounted. Particularly, it is an example of a variable shaped beam (VSB) writing apparatus. The writing unit 150 includes an electron gun system 230, an electron optical column 102 and a writing chamber 103. In the electron gun system 230, an electron gun 201 is arranged. In the electron optical column 102, there are arranged an electron lens 211, an illumination lens 202, a blanking deflector 212, a blanking aperture 214, a first aperture plate 203, a projection lens 204, a deflector 205, a second aperture plate 206, an objective lens 207, a main deflector 208, and a sub deflector 209. In the writing chamber 103, an XY stage 105 is arranged. On the XY stage 105, there is placed a target object or "sample" 101 such as a mask serving as a writing target substrate when writing is performed. For example, the target object 101 is an exposure mask used for manufacturing semiconductor devices. The target object 101 may be, for example, a mask blank on which resist has been applied and nothing has yet been written. For example, a pair of electrodes is used as the blanking deflector 212.

The electron gun 201 includes the cathode 320 selected according to the first embodiment, a Wehnelt 322, and an anode 324. It is preferable for the cathode body 30 to be made from lanthanum hexaboride (LaB$_6$) crystal, etc., for example. The Wehnelt 322 is arranged between the cathode 320 and the anode 324. The anode 324 is grounded (earthed), and potential is set to be ground potential. An electron gun power unit (not shown) is connected to the electron gun 201. The boundary between the electron gun system 230 and the electron optical column 102 is formed through which electron beams can pass.

The control unit 160 includes a control computer 110 and a control circuit 120.

FIG. 10 shows a configuration necessary for explaining the first embodiment. Other configuration elements generally necessary for the writing apparatus 100 may also be included. For example, although a multiple stage deflector of two stages of the main deflector 208 and the sub deflector 209 is herein used for position deflection, a single stage deflector or a multiple stage deflector of three or more stages may also be used for position deflection. Input devices, such as a mouse and a keyboard, a monitoring device, and the like may be connected to the writing apparatus 100. In the example of FIG. 10, although the blanking aperture plate 214 is arranged at the upstream side of the first aperture plate 203, it is not limited thereto, and any position will do as long as the blanking operation can be performed. For example, the blanking aperture plate 214 may be arranged at the downstream side of the first aperture plate 203 or the second aperture plate 206.

Figure 11:
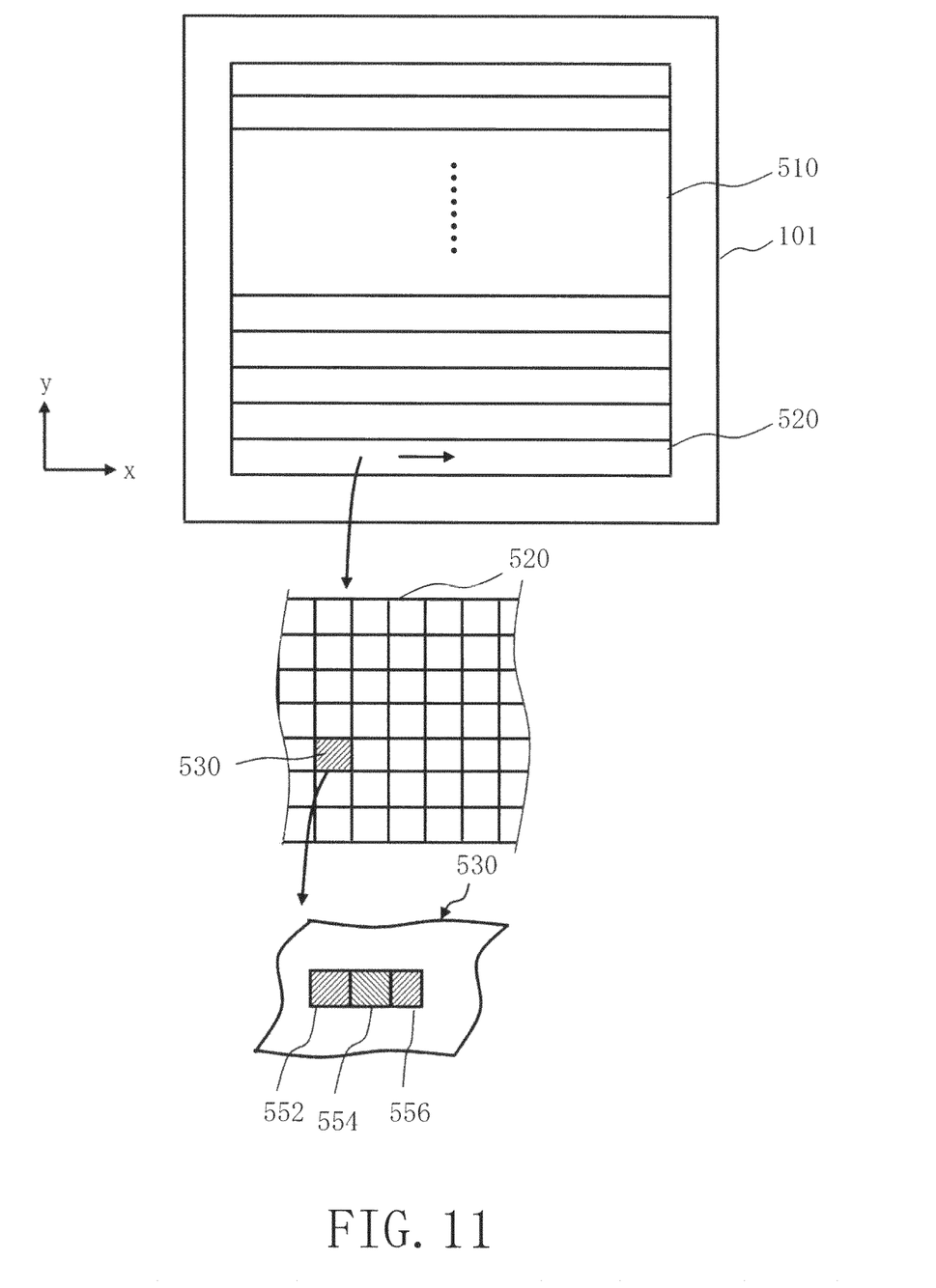
FIG. 11 is a conceptual diagram for explaining each region according to the first Embodiment.

FIG. 11 is a conceptual diagram for explaining each region according to the first Embodiment. In FIG. 11, a writing region 510 of the target object 101 is virtually divided into a plurality of stripe regions 520 each being in a strip shape and each having a width deflectable in the y direction by the main deflector 208. Further, each of the stripe regions 520 is virtually divided into a plurality of subfields (SFs) 530 (small regions) each having a size deflectable by the sub deflector 209. Shot FIGS. 552, 554, and 556 are written at corresponding shot positions in each SF 530.

A digital signal for blanking control is output from the control circuit 120, which is operated by a control signal from the control computer 110, to a DAC amplifier (not shown) for blanking control. Then, in the DAC amplifier for blanking control, the digital signal is converted to an analog signal, and amplified to be applied as a deflection voltage to the blanking deflector 212. An electron beam 200 is deflected by this deflection voltage in order to control the irradiation time (irradiation amount) of each shot.

A digital signal for main deflection control is output from the control circuit 120 to a DAC amplifier (not shown). Then, in the DAC amplifier for main deflection control, the digital signal is converted to an analog signal and amplified to be applied as a deflection voltage to the main deflector 208. By this deflection voltage, the electron beam 200 is deflected, and thereby each beam shot is deflected to a reference position in a target SF 530 in the virtually divided mesh like SFs.

A digital signal for sub deflection control is output from the control circuit 120 to a DAC amplifier (not shown). Then, in the DAC amplifier for sub deflection control, the digital signal is converted to an analog signal and amplified to be applied as a deflection voltage to the sub deflector 209. The electron beam 200 is deflected by this deflection voltage, and thereby each beam shot is deflected to each shot position in the target SF 530.

The writing apparatus 100 performs writing processing in each stripe region 520 by using a multiple stage deflector of a plurality of stages. Here, as an example, a two-stage deflector composed of the main deflector 208 and the sub deflector 209 is used. While the XY stage 105 is continuously moving in the −x direction, for example, a pattern is written in the x direction in the first stripe region 520. After the pattern writing in the first stripe region 520 has been completed, a pattern is written in the second stripe region 520 in the same or opposite direction. Then, in the same way, patterns are written in the third and subsequent stripe regions 520. The main deflector 208 deflects the electron beam 200 in sequence to a reference position of the SF 530 so as to follow the movement of the XY stage 105. The sub deflector 209 deflects the electron beam 200 from the reference position of each SF 530 to each shot position of an irradiating beam in the SF 530 concerned. Thus, the sizes of the deflection regions of the main deflector 208 and the sub deflector 209 are different from each other. The SF 530 is the smallest deflection region in the deflection regions of the multiple stage deflector.

If the cathode 320 is heated in the state in which a negative acceleration voltage is applied to the cathode 320 and a negative bias voltage is applied to the Wehnelt 322, electrons (electron group) are emitted from the cathode 320 and the emitted electrons (electron group) are spread after (cathode crossover) forming a convergence point (crossover: C.O.) and accelerated by the acceleration voltage to become an electron beam advancing toward the anode 324. Then, the electron beam passes through an opening in the anode 324, thereby, the electron beam 200 is emitted from the electron gun 201.

The electron beam 200 emitted from the electron gun 201 (an emission unit) is converged by the electron lens 211 at the central height position (an example of a predetermined position) in the blanking deflector 212, for example, and a convergence point (crossover: C.O.) is formed. Then, when passing through the blanking deflector 212 which is arranged at the downstream side of the electron lens 211 with respect to the direction of the optical axis, beam-on or beam-off is controlled by the blanking deflector 212 controlled by a deflection signal from the DAC amplifier 122 for blanking. In other words, when performing blanking control of switching between beam-on and beam-off, the blanking deflector 212 deflects the electron beam. The electron beam having been deflected to be in a beam-off state is blocked by the blanking aperture plate 214 (blanking aperture member) arranged at the downstream side of the blanking deflector 212 with respect to the direction of the optical axis. That is, when in the beam-on state, it is controlled to pass through the blanking aperture plate 214, and when in the beam-off state, it is deflected such that the entire beam is blocked by the blanking aperture plate 214. The electron beam 200 that has passed through the blanking aperture plate 214 during the period from becoming a beam-on state from a beam-off state to again becoming a beam-off state serves as one shot of the electron beam. The blanking deflector 212 controls the direction of the passing electron beam 200 to alternately generate a beam-on state and a beam-off state. For example, when in a beam-on state, a voltage of 0V (or not to apply any voltage) is applied to the blanking deflector 212, and, when in a beam-off state, a voltage of several V is applied to it. The dose per shot of the electron beam 200 to irradiate the target object 101 is adjusted depending upon an irradiation time t of each shot.

As described above, each shot of the electron beam 200, generated by passing through the blanking deflector 212 and the blanking aperture plate 214, irradiates the whole of the first shaping aperture plate 203 which has a quadrangular opening by the illumination lens 202. At this stage, the electron beam 200 is first shaped to a quadrangle. Then, after passing through the first shaping aperture plate 203, the electron beam 200 of the first aperture image is projected onto the second shaping aperture plate 206 by the projection lens 204. The first aperture image on the second shaping aperture plate 206 is deflection-controlled by the deflector 205 so as to change (variably shape) the shape and size of the beam. Such variable beam shaping is performed for each shot, and, generally, each shot is shaped to have a different shape and size. Then, after passing through the second shaping aperture plate 206, the electron beam 200 of the second aperture image is focused by the objective lens 207, and deflected by the main deflector 208 and the sub deflector 209 to reach a desired position on the target object 101 placed on the XY stage 105 which moves continuously. In other words, an electron beam in a beam-on state is focused onto the target object 101 by the objective lens 207 which is arranged at the downstream side compared to the blanking aperture plate 214 with respect to the direction of the optical axis. FIG. 1 shows the case of using multiple stage deflection of the main and sub deflection for position deflection. In such a case, the main deflector 208 may deflect the electron beam 200 of a shot concerned to a reference position in an SF 30 while following the movement of the stage, and the sub deflector 209 may deflect the beam of the shot concerned to each irradiation position in the SF. A figure pattern defined in writing data is written by repeating such operations and combining a shot figure of each shot.

According to the first embodiment, since a selected high brightness cathode 320 is mounted, the writing processing can be performed in desired brightness.

Although a plurality of cathodes are produced and a high brightness cathode 320 is selected from them in the example described above, the number of cathodes to be produced is not limited to that case, and it is acceptable as long as at least one cathode is produced. The case of producing a plurality of cathodes has already been described above. The case of producing one cathode is now described below. In the cathode production step (S106) of FIG. 1, a cathode 320 for production which includes the cathode body 30 and the cover part 40, provided with the gap 50, covering the side surface 21 of the cathode body 30 is produced. The production method of the cathode 320 is what is described above.

In the radius ($r_1$) measurement step (S108), with respect to the cathode 320 for production, the outer dimension (radius $r_1$) of the upper surface 22 of the cathode body 30 (electron emission member) is measured using an optical microscope.

In the radius ($r_2$) measurement step (S110), with respect to the cathode 320 for production, the outer dimension (radius $r_2$) of the gap 50 at the surface 400 being the same surface as the upper surface 22 of the cathode body 30 (electron emission member) is measured using an optical microscope.

As described above, it is efficient to measure the outer dimension (radius $r_1$) of the upper surface 22 and the outer dimension (radius $r_2$) of the gap 50 at the same time or period.

In the area ratio (R) calculation step (S112), for the cathode 320 for production, an area ratio R is calculated by dividing the area of the gap 50 at the surface 400 being the same surface as the upper surface 22 by the area of the upper surface 22 of the cathode body 30 (electron emission member). The area ratio R can be obtained by using the equation (9) described above.

Reading the selection step (S114) as an obtaining step (S114), it is determined whether the area ratio R of the produced cathode 320 is less than or equal to the upper limit Rm or not, and the cathode having the area ratio R less than or equal to the upper limit Rm is obtained in the obtaining step (S114). The other contents are the same as those described above.

Thus, according to the first embodiment, it is possible to obtain a cathode with which a desired brightness level can be acquired. Accordingly, the cathode responding to the high brightness is obtained.

The embodiments have been explained referring to concrete examples described above. However, the present invention is not limited to these specific examples. The electron beam apparatus in which the selected cathode is mounted is not limited to the writing apparatus, and can be applied to other electronic beam apparatuses, such as an electron microscope, etc.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other cathode obtaining method and electron beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:
1. A cathode obtaining method comprising:
   producing a plurality of cathodes each of which includes an electron emission member and a cover part, provided with a gap, covering a side surface of the electron emission member;
   measuring an outer dimension of an upper surface of the electron emission member, for each cathode of the plurality of cathodes;
   measuring an outer dimension of the gap at a same surface as the upper surface of the electron emission member, for the each cathode of the plurality of cathodes;

calculating an area ratio by dividing an area of the gap at the same surface by an area of the upper surface of the electron emission member, for the each cathode of the plurality of cathodes;

obtaining an upper limit of the area ratio corresponding to a desired brightness by using a correlation between brightness and the area ratio; and selecting a cathode having the area ratio less than or equal to the upper limit from the plurality of cathodes that have been produced.

2. The method according to claim 1, wherein one of lanthanum hexaboride ($LaB_6$) and cerium hexaboride ($CeB_6$) is used as material of the electron emission member, and carbon (C) is used as material of the cover part.

3. The method according to claim 1, wherein an upper part of the electron emission member is formed to be a conical shape with a truncated flat tip.

4. The method according to claim 1, wherein the cathode to be selected includes a cathode in which the outer dimension of the gap at the same surface as the upper surface of the electron emission member and a shape of the upper surface of the electron emission member do not form concentric circles.

5. The method according to claim 1 further comprising:
acquiring the correlation between the brightness and the area ratio by experiment.

6. The method according to claim 5, wherein the acquiring the correlation includes
measuring brightness of each cathode for experiment, using a plurality of cathodes for experiment,
calculating an area ratio of the each cathode for experiment, and
performing the acquiring the correlation by using the brightness and the area ratio of the each cathode for experiment.

7. The method according to claim 1, wherein the upper surface of the electron emission member is an electron emission surface.

8. The method according to claim 1, wherein the outer dimension of the upper surface is measured using an optical microscope.

9. The method according to claim 8, wherein the outer dimension of the gap is measured using the optical microscope.

10. An electron beam writing apparatus comprising:
an electron gun in which a cathode obtained by the cathode obtaining method according to claim 1 is mounted; and
a writing unit configured to write a pattern on a target object, using an electron beam emitted from the cathode.

11. A cathode obtaining method comprising:
producing a cathode that includes an electron emission member and a cover part, provided with a gap, covering a side surface of the electron emission member;
measuring an outer dimension of an upper surface of the electron emission member of the cathode;
measuring an outer dimension of the gap, at a same surface as the upper surface of the electron emission member, of the cathode;
calculating an area ratio of the cathode by dividing an area of the gap at the same surface by an area of the upper surface of the electron emission member;
obtaining an upper limit of the area ratio corresponding to a desired brightness by using a correlation between and the area ratio having been obtained in advance; and
determining whether the cathode produced has the area ratio less than or equal to the upper limit, and obtaining the cathode having the area ratio less than or equal to the upper limit.

* * * * *